United States Patent [19]

Dakin et al.

[11] 4,334,152
[45] Jun. 8, 1982

[54] POSITION INDICATING SYSTEMS

[75] Inventors: John P. Dakin, Chandlers Ford; David A. Kahn, Bittern, both of England

[73] Assignee: Plessey Incorporated, New York, N.Y.

[21] Appl. No.: 100,144

[22] Filed: Dec. 4, 1979

[30] Foreign Application Priority Data

Dec. 6, 1978 [GB] United Kingdom ............... 47428/78

[51] Int. Cl.³ .................................................. G01J 3/34
[52] U.S. Cl. .............................. 250/226; 250/231 SE
[58] Field of Search ................. 250/226, 227, 231 SE, 250/237 G; 340/347 P; 356/402

[56] References Cited

U.S. PATENT DOCUMENTS

| | | | |
|---|---|---|---|
| 3,151,247 | 9/1964 | Auvermann | 250/226 |
| 3,399,347 | 8/1968 | Martens | 250/231 SE |
| 3,482,105 | 12/1969 | Hutzler | 250/226 |
| 3,821,549 | 6/1974 | Gloge | 250/227 |
| 4,045,667 | 8/1977 | Hanson | 250/226 |

*Primary Examiner*—David C. Nelms
*Attorney, Agent, or Firm*—Fleit & Jacobson

[57] ABSTRACT

A position indicating system for affording an indication of the instantaneous position of a movable member, such as a rotating shaft, comprises means for producing light in different color bands directed on to a suitably coded structure movable in accordance with movement of the movable member or coded structure which itself carried filter means for separating light into different colors. Optical fibre means is located for receiving colored light passing through the movable coded structure and for transmitting light to light detector means for producing an output dependent upon the light received by the optical fibre means and indicative of the instantaneous position of the movable member.

8 Claims, 3 Drawing Figures

POSITION INDICATING SYSTEMS

This invention relates to position indicating systems and relates more especially, but not exclusively, to such position indicating systems for providing an indication of the angular position of rotating shafts.

According to the present invention there is provided a position indicating system for affording an indication of the instantaneous position of a movable member, such as a rotating shaft, in which means associated with a suitably coded structure movable in accordance with movement of said movable member are provided for producing light in different colour bands or separating such bands from light and in which optical fibre means is located for receiving coloured light passing through said movable coded structure and for transmitting said light to light detector means for producing an output dependent upon the light received by said optical fibre means and indicative of the instantaneous position of said movable member.

The means for producing or separating different colour bands is preferably separate from the movable coded structure but it should be understood that the means concerned could be attached to the coded structure. The means just referred to may comprise a suitable filter attached to or separate from the coded structure or the means may include a diffraction grating or prism separate from the coded structure.

In carrying out the present invention the optical fibre means may comprise a linear array of optical fibres at its light receiving end, which linear array is converted into a circular array or bundle before being transformed back into another linear array at the detector means end of the fibres. It is preferred to embody light-scrambling means in the optical fibre bundle so as to divide the colour content of the fibres equally among the optical fibres of the bundle. This light scrambling action may be achieved for example by splitting the circular bundle of optical fibre and then positioning the respective ends of the bundle of fibres against the ends of a relatively large-core optical fibre so that the coloured light content of fibres at the input end of the same scrambling means is distributed evenly among the optical fibres at the output end of the scrambling means. The component colours may be separated from the total light content of these optical fibres by means of wavelengthdependent beam splitters or by using a graded interference filter between the output of the optical fibre array and the detector means.

In the case of a rotating shaft position indicating system the suitability coded structure may comprise a binary coded disc secured to the shaft with a linear array of optical fibres being located along a radius of the coded disc on the side thereof remote from the side on to which different colour bands (e.g. spectrum) are projected, as by means of light passing through a graded interference filter.

The output from the detecting means of the system according to the invention may conveniently be provided in digital form and may be displayed at a remote location relative to the movable member.

By way of example the present invention will now be described with reference to the accompanying drawings in which:

FIG. 3 is a diagram of a three-bit coded disc suitable for use in the system shown in FIGS. 1 and 2.

Figure 1:
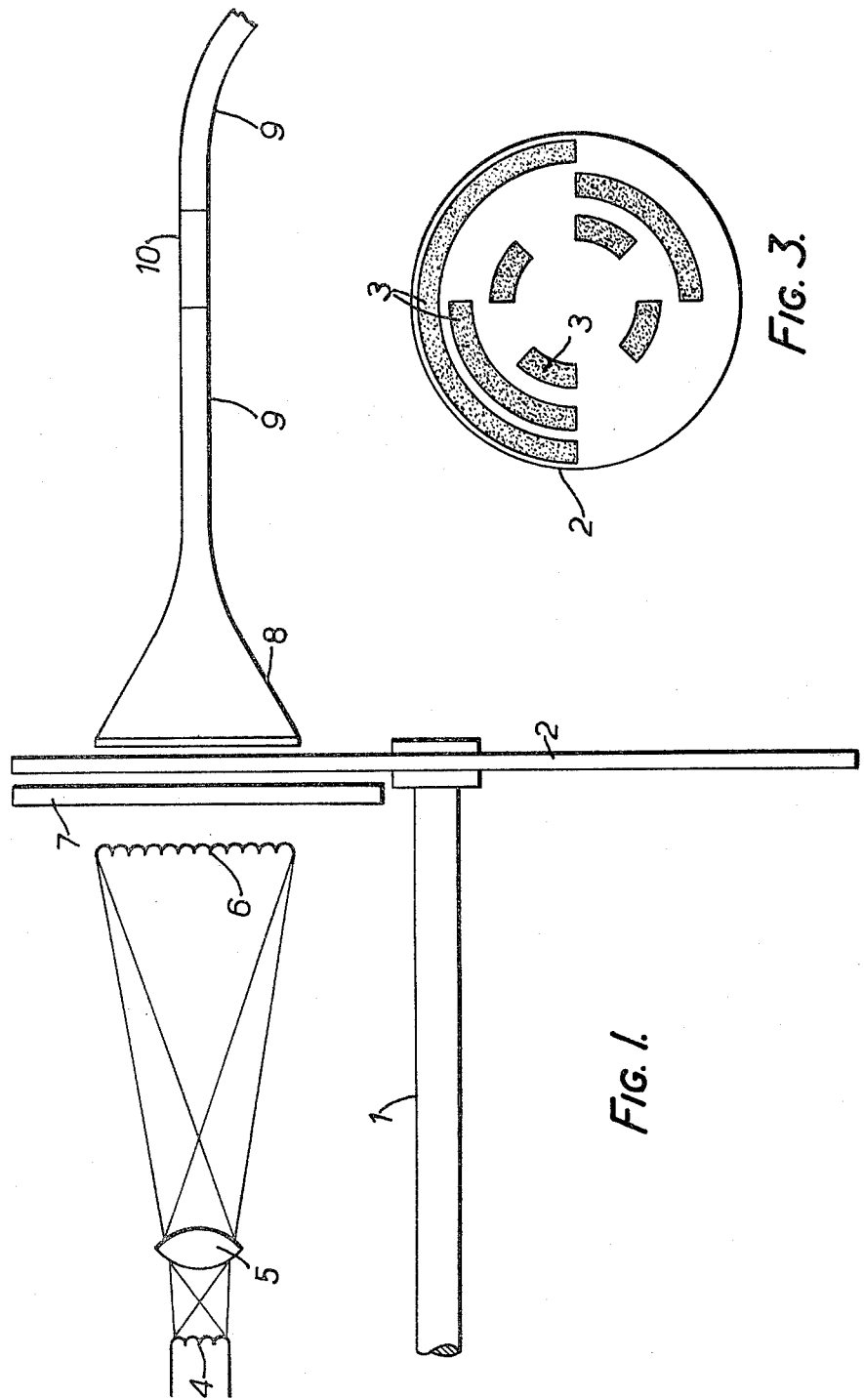
FIG. 1 is a diagram depicting the transmitting end of a shaft position indicating system.

Referring to FIG. 1 of the drawings rotatable shaft 1 has secured to it a binary-coded disc 2 which may be of the simple form depicted in FIG. 3 in which binary-coded light absorbing arcuate strips 3 affording eight angular three-bit codes are provided on a transparent disc. It should of course be understood that the disc could alternatively be opaque with the binary-coded strips being transparent and, moreover, that the number of angular binary codes provided by the disc, and thus the sensitivity of the system as regards indicating the instantaneous angular position of the shaft, may be increased considerably by increasing the number of binary code bits.

Figure 2:
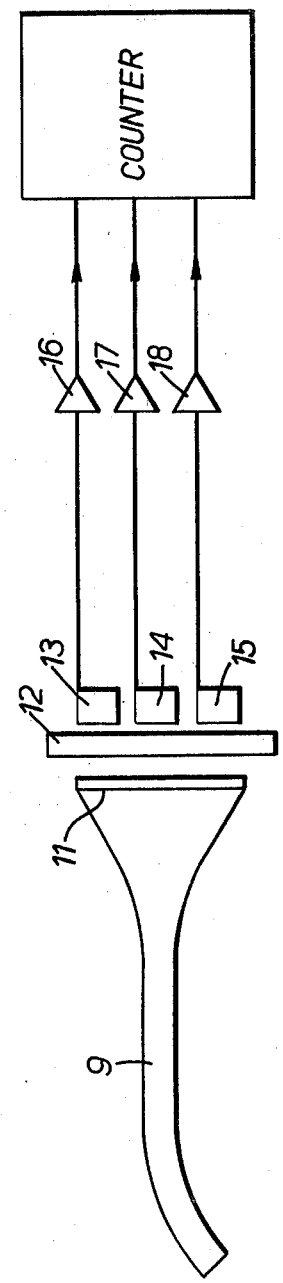
FIG. 2 is a diagram depicting the receiving end of the shaft position indicating system.

Light produced by a lamp filament 4 passes through condenser lens 5 and provides an image 6 of the filament close to a graded interference filter 7 which is spaced from the coded disc 2 and which splits the light into the colours of the spectrum in the radial direction of the coded disc 2. A prism could alternatively be used for the filter 7 or an annular filter could be attached to the coded disc 2. On the side of the coded disc 2 remote from the filter 7 there is provided along the radius of the disc 2 a lineary array of optical fibres 8. As thus far described, in operation of the system with the shaft and disc rotating, the optical fibres 8 which are not obscured by the light absorbing strips 3 on the coded disc 2 will receive light of different colours according to their radial locations. The coloured light will pass along the optical fibres which are formed into a circular bundle, as indicated at 9. This bundle of fibres 9 is split by the interposition of a light scrambling device 10 which may comprise a relatively large diameter optical fibre against the respective ends of which the ends of all the fibres of the split bundle 9 abut. In this way the different coloured light entering the scrambling device 10 from the opical fibres of bundle 9 is dispersed or multiplexed within the device 10 and divided equally among the optical fibres of the bundle 9 on the output side of the device 10. The optical fibres again open up into linear array 11 at the detecting end of the system shown in FIG. 2. Light from the fibres of array 11 passes through graded interference filter 12 in order to divide the light into colour bands which will be detected by detectors 13, 14 and 15 (e.g. silicon PIN diodes) producing outputs which after amplification by amplifiers 16, 17 and 18 are fed to a counter device for providing a digital display indicating the angular position of the shaft 1 at any instant. Instead of detectors 13, 14 and 15 wavelength-dependent beam splitters may be used, especially when the light power is at a low level.

As an alternative to the provision of the graded interference filter 7 the binary-coded disc 2 may carry band stop filters which subtract the colours from the white light projected on to the disc and in this case the strips 3 may be superimposed one upon the other.

As a further alternative to the graded interference filter 7 a diffraction grating and associated lens system may be provided to produce different colour bands on the coded disc 2. A further diffraction grating and lens system may be substituted for the filter 12 at the receiving end of the system.

What we claim is:

1. A position indicating system for affording an indication of the instantaneous position of a movable member, comprising:
- a coded structure rotatably movable in accordance with movement of said movable member;
- deriving means associated with said coded structure for deriving different colour light bands from broadband light;
- optical fibre means for receiving colour light bands emerging from said movable coded structure, said optical fibre means having light scrambling means disposed therein for multiplexed transmission of the colour light bands; and
- light detector means for receiving said transmitted colour light bands, and for producing an output dependent upon the light received by said optical fibre means and indicative of the instantaneous position of said movable member.

2. A position indicating system as claimed in claim 1, wherein the deriving means is separate from the movable coded structure.

3. A position indicating system as claimed in claim 2, wherein the deriving means comprises a graded interference filter.

4. A position indicating system as claimed in claim 2, wherein the deriving means comprises a diffraction grating and associated lens system.

5. A position indicating system as claimed in any one of the preceding claims, wherein the optical fibre means has a light receiving end and a detector end, and comprises a linear array of optical fibres at the light receiving end, said linear array being converted into one of a circular array and a bundle before being transformed back into another linear array at the detector end of the optical fibre means.

6. A position indicating system as claimed in claim 1, wherein said optical fibre means includes bundle fibres, and the light scrambling means comprises a relatively large optical fibre having ends against which the ends of all the bundle fibres abut.

7. A position indicating system as claimed in claim 1, wherein the coded structure is a binary coded disc attached to a shaft, the shaft having a position which is indicated by the system.

8. A position indicating system as claimed in claim 1, further comprising a counter device, and wherein the light detector means comprises diodes having outputs which are used to operate the counter device for providing a digital display indicating the position of the movable member.

* * * * *